United States Patent [19]

Norman et al.

[11] Patent Number: 5,200,920
[45] Date of Patent: Apr. 6, 1993

[54] METHOD FOR PROGRAMMING PROGRAMMABLE ELEMENTS IN PROGRAMMABLE DEVICES

[75] Inventors: Kevin A. Norman, Belmont; James D. Sansbury, Portola Valley; Alan L. Herrmann, Sunnyvale; Matthew C. Hendricks, Los Gatos; Behzad Nouban, Mountain View, all of Calif.

[73] Assignee: Altera Corporation, San Jose, Calif.

[21] Appl. No.: 759,944

[22] Filed: Sep. 17, 1991

Related U.S. Application Data

[63] Continuation of Ser. No. 476,715, Feb. 8, 1990, abandoned.

[51] Int. Cl.⁵ .................. G11C 11/34; G11C 7/00; G11C 29/00
[52] U.S. Cl. .................... 365/185; 365/201
[58] Field of Search ............ 365/185, 201, 163, 184; 357/2

[56] References Cited

U.S. PATENT DOCUMENTS

| | | | |
|---|---|---|---|
| 3,566,153 | 2/1971 | Spencer, Jr. | 307/205 |
| 4,124,899 | 11/1978 | Birkner et al. | 364/716 |
| 4,225,946 | 9/1980 | Neale et al. | 365/163 |
| 4,228,524 | 10/1980 | Neale et al. | 365/163 |
| 4,279,024 | 7/1981 | Schrenk | 365/185 |
| 4,357,685 | 11/1082 | Daniele et al. | 365/185 |
| 4,389,713 | 7/1983 | Patel et al. | 365/163 |
| 4,599,705 | 7/1986 | Holmberg et al. | 365/163 |
| 4,609,986 | 9/1986 | Hartmann et al. | 364/200 |
| 4,617,479 | 10/1986 | Hartmann et al. | 307/465 |
| 4,713,792 | 12/1987 | Hartmann et al. | 364/900 |
| 4,811,294 | 3/1989 | Kobayashi et al. | 365/185 |
| 4,943,948 | 7/1990 | Morton et al. | 365/201 |
| 5,043,940 | 8/1991 | Harari | 365/185 X |

OTHER PUBLICATIONS

Wilson, "1-Mbit Flash Memories Seek Their Role in System Design", Computer Design, Mar. 1989, pp. 30, 32.
Intel Corporation, Application Note AP-151, "The Intelligent Programming algorithm—Fast Programming for Intel EPROMs", by Knowlton (Dec. 1982), Intel Memory Component Handbook (1983).
Cromie, J., EPLD Programmer Design, Electronic & Wireless World, pp. 157-160, 95, No. 1636, Feb., 1989, Sutton, Surrey, Great Britain.

Primary Examiner—Joseph L. Dixon
Assistant Examiner—Michael A. Whitfield
Attorney, Agent, or Firm—Jeffrey H. Ingerman

[57] ABSTRACT

A method for programming programmable EPROM elements in programmable logic arrays. Multiple programming passes are made through the array, with the programming pulses decreasing in duration on each pass.

30 Claims, 4 Drawing Sheets

METHOD FOR PROGRAMMING PROGRAMMABLE ELEMENTS IN PROGRAMMABLE DEVICES

This is a continuation of application Ser. No. 07/476,715, filed Feb. 8, 1990, now entitled METHOD FOR PROGRAMING PROGRAMMABLE ELEMENTS IN PROGRAMMABLE DEVICES.

BACKGROUND OF THE INVENTION

Programmable logic devices of the types described generally in Spencer U.S. Pat. No. 3,566,153, Birkner et al. U.S. Pat. No. 4,124,899, Hartmann et al. U.S. Pat. No. 4,609,986, Hartmann et al. U.S. Pat. No. 4,617,479 and Hartmann et al. U.S. Pat. No. 4,713,792 can be implemented using fuses, anti-fuses, erasable programmable read-only memory (EPROM), electrically erasable programmable read-only memory (EEPROM) or flash EPROM as their programmable elements. Such devices are typically set up as basically orthogonal arrays of "bit lines" and "word lines" which can be programmably interconnected to achieve a desired logical result. It is known that the programmable interconnections in such devices can be programmed by addressing the appropriate bit lines and word lines, and transferring the desired programming data to the interconnections by applying to the selected word lines and bit lines a predetermined programming voltage—e.g., a voltage significantly higher than that encountered in the normal logical operation of the device. When the programmable elements are any of the above-mentioned types of EPROM using floating gate field effect transistors, the high programming voltages trap electrons on the floating gate of the transistor, raising the threshold voltage, as seen from the control gate of the transistor, needed to turn the transistor on. It is desirable that the threshold be raised as high as possible above normal operating voltage, to provide a guard band effect in case of voltage variations during normal operation.

Traditionally, programmable logic devices have been programmed by passing once through the array and sequentially programming each programmable interconnection, or "cell." In the earliest known programming scheme, the programming voltages were applied once to each cell for relatively long periods—e.g., 45–50 msec. In a later programming scheme, shorter pulses were used—e.g., 1 msec, and each cell received a plurality—e.g., up to fifteen—pulses. In this later scheme, the cell was verified after each pulse, and if that cell had already reached the desired voltage, programming of that cell was discontinued and the process continued on the next cell.

In using the prior schemes, it has been observed that certain devices could not be programmed because one or more cells would not reach the desired voltage. This was true even if very long pulses, or a high number—even higher than the normal number of repetitions—of pulses, were applied. Other devices could be programmed if very long pulses or a high number of pulses were applied. However, such devices would fail the normal programming procedure and require special handling. In addition, the more one tried to program the difficult cells in such devices, the more one stressed the entire device and disturbed "half-selected" bits—i.e., other cells which shared either the bit line or the word line of the cell being programmed.

It would be desirable to be able provide a method of programming programmable logic devices that is faster than known programming methods, that achieves the highest possible programmed voltage, and that would decrease the number of failed devices.

It would also be desirable to be able to provide such a programming method that would minimize the stress on the device and the disturbance of already programmed cells.

SUMMARY OF THE INVENTION

It is an object of this invention to provide a method of programming programmable logic devices that is faster than known programming methods, that achieves a higher programmed voltage, and that decreases the number of failed devices.

It is also an object of this invention to provide such a programming method that minimizes the stress on the device and the disturbance of already programmed cells.

In accordance with the present invention, there is provided a method for programming a programmable logic device. The device has an array of erasable programmable read-only memories. At least one high-voltage programming pulse must be applied to each erasable programmable read-only memory, for a predetermined duration, to program the device. The method includes the steps of selecting a first duration shorter than the predetermined duration, and applying at least one programming pulse of the first duration to each of the erasable programmable read-only memories.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
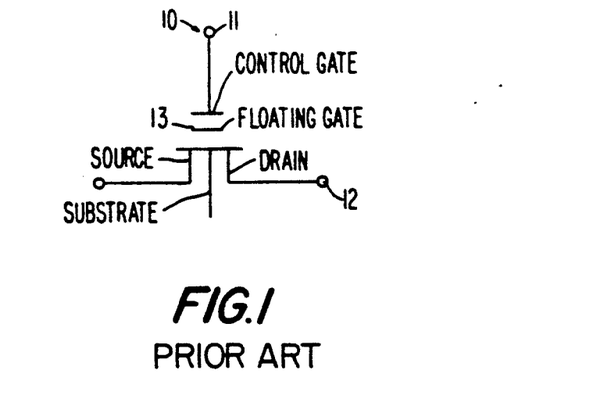
FIG. 1 is a schematic representation of an EPROM transistor used as a programmable interconnection element in programmable logic devices implemented with EPROM.
Figure 2:
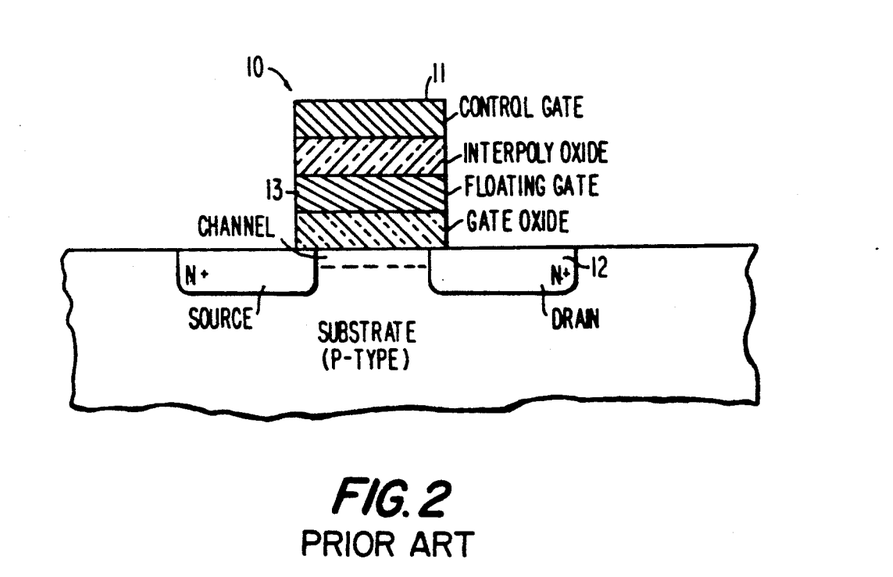
FIG. 2 is a cross-sectional view of the EPROM transistor of FIG. 1.

In the case of a programmable logic device using EPROM for its programmable elements, an EPROM element such as a floating gate field effect transistor 10, shown in FIGS. 1 and 2, commonly referred to as an EPROM transistor, is programmed when the voltage on its control gate 11 is at a voltage (e.g., 12 volts) that is significantly higher than the voltage during normal operation (typically 5 volts) and the voltage at the drain 12 of EPROM element 10 is at a voltage (e.g., 10–12 volts) higher than the voltage during normal operation (e.g., 5 volts).

The presence of high voltages at both gate 11 and drain 12 of EPROM transistor 10 causes electrons to be injected into the floating gate 13. Electrons on floating gate 13 remain trapped on floating gate 13 after high voltages are removed. The presence of electrons on floating gate 13 causes the threshold voltage as seen from control gate 11 to be substantially increased from its initial value (e.g., from an initial value of 1 to 2 volts to a new value above 5 volts) such that under normal gate voltages of +5 volts the transistor is not turned on. Thus an unprogrammed EPROM transistor will conduct with 5 volts on the gate and will not conduct with 0 volt on the gate, while a programmed EPROM transistor will not conduct in either state.

The pattern of programmed and unprogrammed cells in a programmable logic array determines the programming of the array. A particular cell (EPROM) is programmed by applying the programming voltages to the bit line and word line at whose intersection the cell lies, the control gate 11 being connected, in the preferred embodiment, to a word line, and the drain 12 being connected, in the preferred embodiment, to a bit line.

As stated above, it is known to program programmable logic devices by applying, to each cell in the array in order, either one pulse of approximately 50 msec duration, or a plurality of pulses of approximately 1 msec duration. However, depending on the individual physical structure of a particular EPROM with the device, it may be harder to program than the average EPROM in the given device, because of minor and expected manufacturing variations in the details of the individual physical structure. Therefore, using the known techniques, there were certain cells that were much more difficult to program, and others that would fail to program to required levels for any chosen number or width of pulses. Further, it is also known that the programmability of an EPROM degrades with temperature. Because the programming process heats the device, the harder one tries to program a difficult cell, the more it may resist being programmed. Moreover, in an array, repeated attempts to program a difficult cell can disturb already programmed cells to the point that they are no longer as fully programmed. Therefore, the degree to which one can continue to attempt to program a difficult cell is limited. On the other hand, if even one cell cannot be adequately programmed, then the entire device may be useless.

The programming method of the present invention allows easier programming of difficult cells in a programmable logic device, while minimizing disturbance of other cells in the device. According to the present invention, a programmable logic device is programmed by passing through the device a plurality of times, preferably three times, applying a plurality of voltage pulses to each cell on each pass. The length of each pulse preferably decreases from pass to pass while the magnitude of each pulse preferably increases. Preferably, after each pulse the cell being programmed is verified and, if it has already reached the desired programmed voltage, programming of that cell is discontinued. The shortening of the pulse duration and the discontinuing of programming on reaching the programmed voltage both shorten total programming time and minimize stress on the device and disturbances of already programmed and half-selected cells.

In a preferred embodiment of the invention, on the first pass through the programmable array, a maximum of twenty pulses is applied to each cell, each pulse having a duration of 200 $\mu$sec. In the second pass, a maximum of eighty pulses each having a duration of 50 $\mu$sec are applied to each cell. In the third pass, a maximum of one hundred pulses each having a duration of 20 $\mu$sec are applied to each cell. After each pass, the cell is verified—i.e., tested to see if it has reached the desired programmed voltage—and if it has reached the programmed voltage, the number of pulses applied to that cell during that pass may be applied again, each for the same duration, to raise the threshold voltage of the cell that much higher over the desired threshold. This "overpulse" technique has the effect of raising the programmed threshold voltage so high that no further programming of most bits will be required. Programming of that cell is then discontinued for that pass. In addition, if a particular cell cannot be verified after the maximum number of pulses of a particular pass, that maximum number of pulses is applied again to that cell, each with the same duration, in case that may prove effective to program the cell, because the alternative is to discard the entire device. This can be done safely because in the event the last regular pulse had been successful, the maximum number of pulses would have been applied again anyway as overpulses.

The amplitude of the programming pulses depends on the physics of the particular device being programmed, while the duration and number of pulses depend on the application and the particular target programmed voltage. In a preferred embodiment of the invention, a programming pulse is applied by applying a voltage between about 12 volts and about 20 volts to the gate of the EPROM cell and a voltage between about 6 volts and about 12 volts to the drain of the EPROM cell. The cell is tested, or verified, by changing the gate voltage to the test voltage and observing the drain-to-source conduction. If the current conducted is more than 1 microamp, the cell is not programmed high enough. If the current conducted is less than 1 microamp, then the cell is programmed to at least the test voltage. In the preferred embodiment, the test voltages for each cell during the first, second and third passes, respectively, are 6.0 volts, 7.6 volts, and 8.2 volts and all cells are verified to 7.6 volts at the end of the first pass, and to 8.2 volts at the end of the second and third passes.

The method of the present invention has been observed to allow the programming of difficult cells more easily, and even to allow the programming of cells that could not be programmed at all using previously known programming methods. Although it is not certain, and is not intended as a limitation of the present invention, it is believed that by using shorter pulses, the present method puts less stress on the device being programmed, and also generates less heat, which otherwise would increase the difficulty of programming.

Figure 3A:
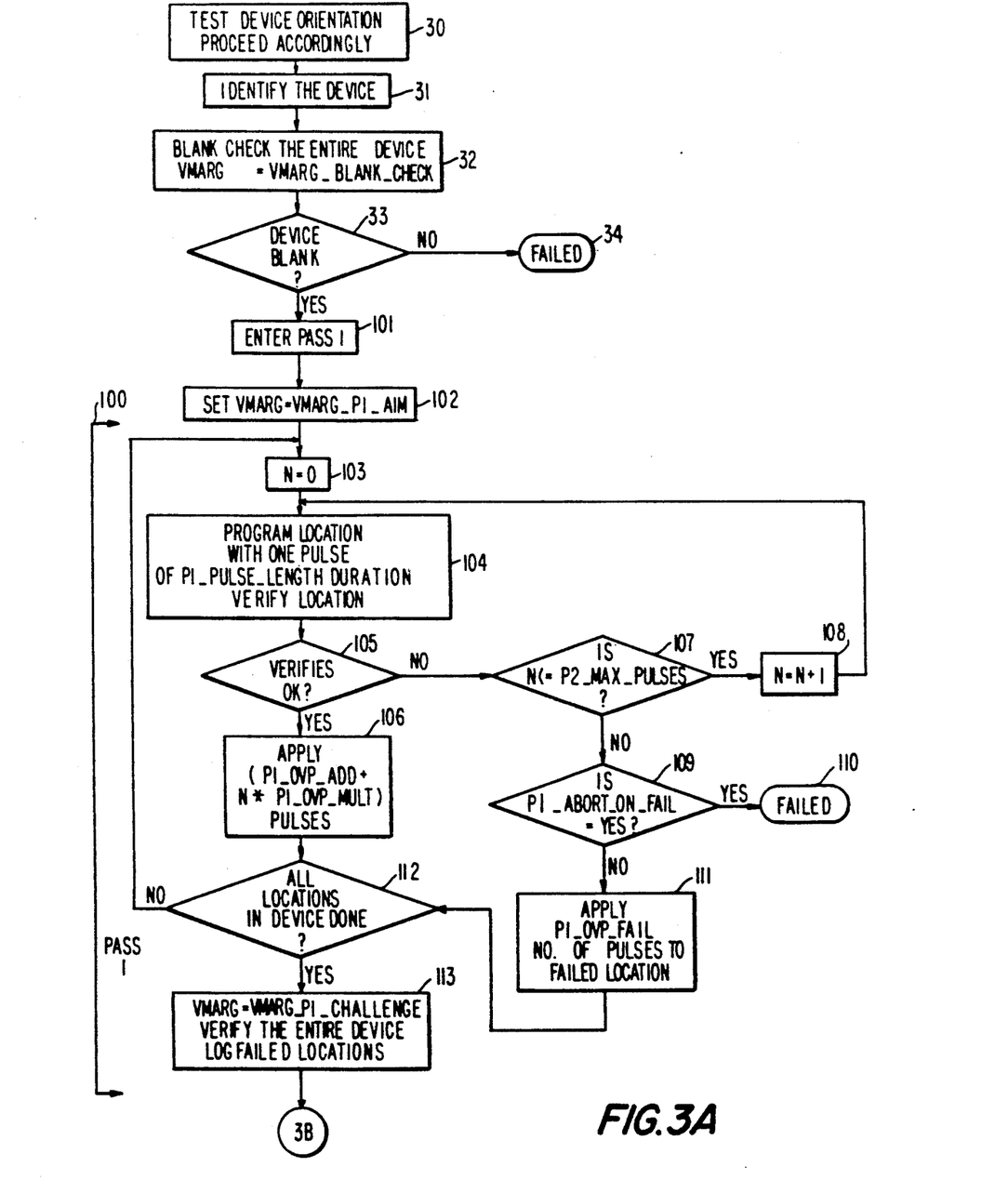
FIGS. 3A, 3B and 3C are a diagram of the method of the invention for programming programmable logic devices.
Figure 3B:
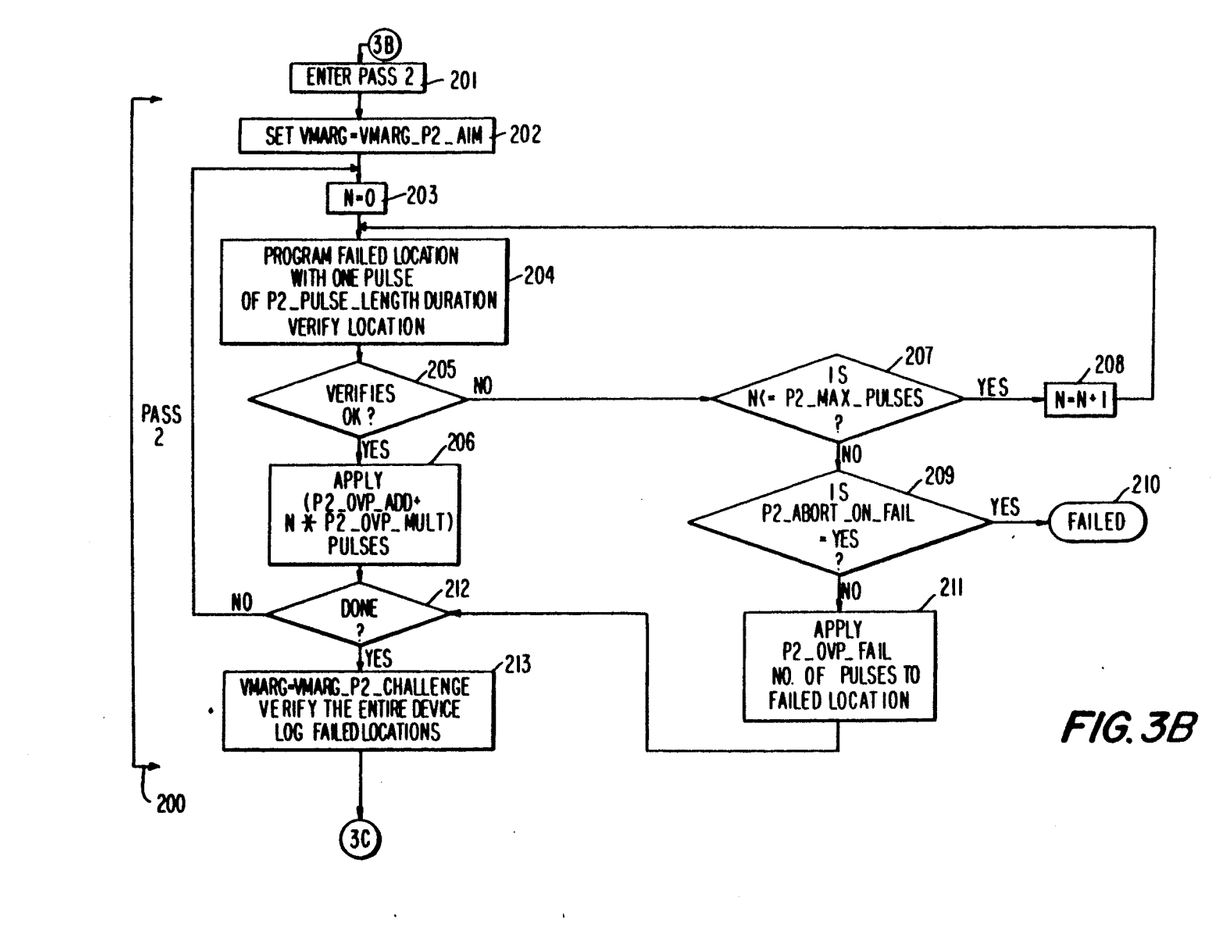
Figure 3C:
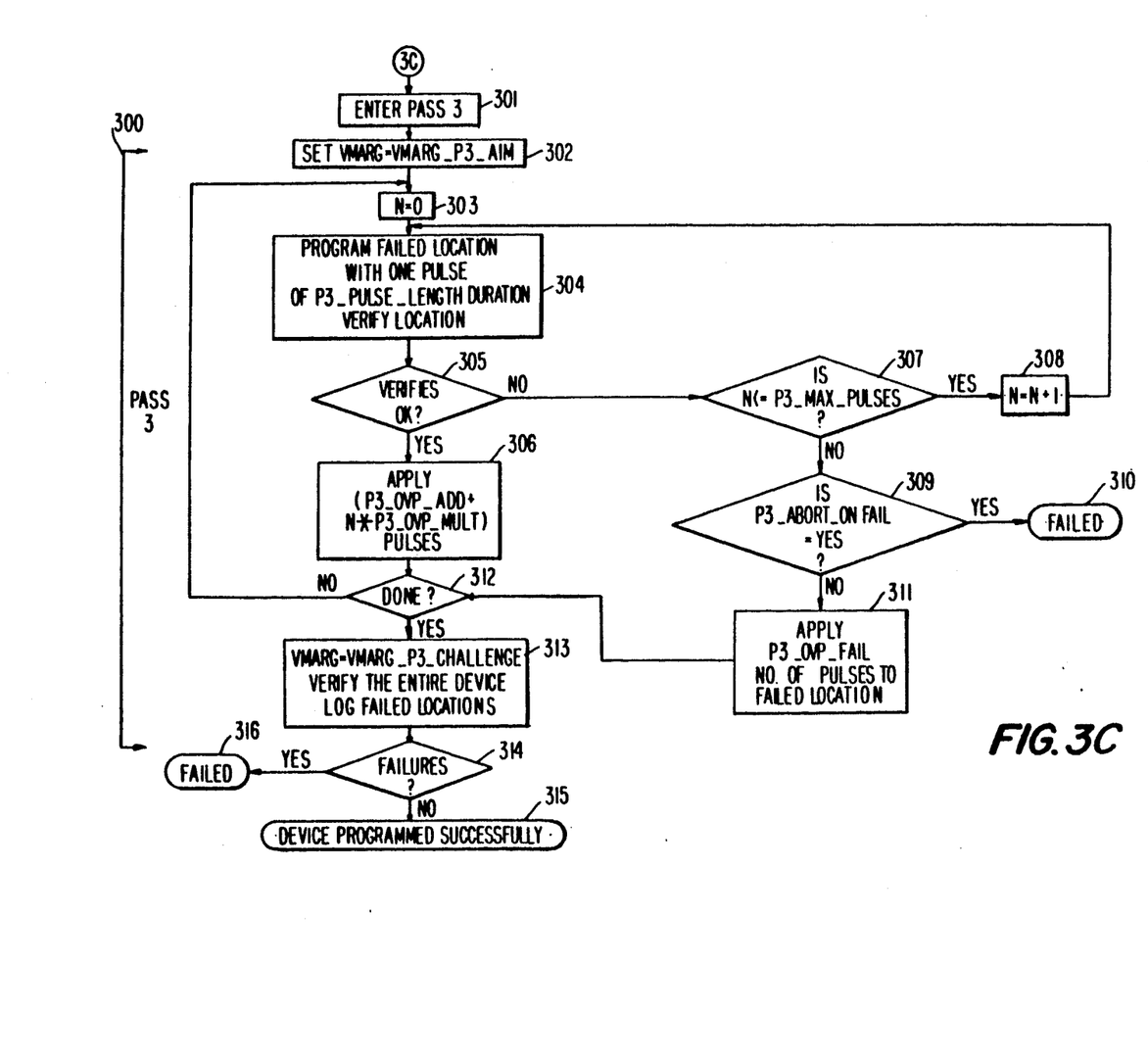

The method of the present invention is diagrammed in FIGS. 3A, 3B and 3C. Steps 30-34 are preliminary steps. The method begins at step 30, and the device to be programmed is identified at step 31, allowing the choice of the appropriate parameters. At step 32, in preparation for verifying that the device is in fact blank, and therefore ready for programming, a voltage value VMARG is set to VMARG_BLANK_CHECK, which is a minimum voltage level which, if present on any cell in the device, indicates that the device is not blank. In a preferred embodiment, VMARG_BLANK_CHECK=3.7 volts. At step 33, each cell is tested to see if the device is blank. If at step 33 the device is not blank, then the device fails the programming process, which then ends at step 34. If at step 33 the device is blank, then the process continues with the first programming pass 100, which begins at 101.

At step 102, in preparation for first programming pass 100, VMARG is set to VMARG_P1_AIM, the target voltage for the first programming pass. In a preferred embodiment, VMARG_P1_AIM=6.0 volts. At step 103, a counter N, which represents the number of programming pulses applied, is set to zero. At step 104, a cell is programmed with one programming pulse.

If at step 105 the cell can be verified at VMARG_P1_AIM, meaning that the (N+1)th pulse raised the cell to the desired programmed voltage, then at step 106 a number of additional pulses, or "overpulses" is applied to the cell to further raise the cell voltage to protect it against disturbances that might otherwise cause the cell to become unprogrammed. The number of overpulses is equal to P1_OVP_ADD+N×P1_OVP_MULT, where P1_OVP_ADD and P1_OVP_MULT are predetermined overpulse constants. In a preferred embodiment, P1_OVP_ADD=0 and P1_OVP_MULT=1, so that the number of overpulses equals the number of pulses that were necessary to originally program the cell.

If at step 105 the cell cannot be verified, meaning the (N+1)th pulse has not raised the cell to the desired programmed voltage, then at step 107 N is tested to see if it is less than P1_MAX_PULSES, which represents a predetermined maximum number of pulses to be applied to any one cell during the first programming pass. In a preferred embodiment, P1_MAX_PULSES=20. If N is less than or equal to P1_MAX_PULSES, then at step 108, N is incremented by 1 and the process returns to step 104. If at step 107 N is greater than P1_MAX_PULSES, then at step 109, the value of P1_ABORT_ON FAIL, which determines whether or not additional attempts to program the device should be made, is examined. In a preferred embodiment, P1_ABORT_ON_FAIL=NO, meaning that further attempts should be made, and at step 111, P1_OVP_FAIL overpulses are applied to the cell, just in case they prove sufficient to program the cell. This can be done because one is prepared to apply a certain number of overpulses to the cell at step 106 even if programming were successful. In a preferred embodiment, P1_OVP_FAIL=0. If P1_ABORT_ON_FAIL=YES, then at step 110 the device is considered to have failed the programming process, which ends there.

At step 112, after the application of overpulses (if any) at step 106 or 111, there is a test to determine if all cells have been addressed yet in the first programming pass. If all cells have not yet been addressed, the process returns to step 103, now pointing to the next address to be programmed. If all cells have been addressed, then at step 113 then entire device is verified by testing each cell against a test voltage VMARG=VMARG_P1_CHALLENGE, which, in a preferred embodiment, is 7.6 volts. Those cells which fail this verification are logged for further programming in second programming pass 200, which begins at step 201. programming pass 200, VMARG is set to VMARG_P2_AIM, the target voltage for the second programming pass. In a preferred embodiment, VMARG_P2_AIM=7.6 volts. At step 203, a counter N, which represents the number of programming pulses applied, is set to zero. At step 204, a cell that had been logged in step 113 is programmed with one programming pulse.

If at step 205 the cell can be verified at VMARG_P2_AIM, meaning that the (N+1)th pulse raised the cell to the desired programmed voltage, then at step 206 a number of overpulses is applied to the cell to further raise the cell voltage to protect it against disturbances that might otherwise cause the cell to become unprogrammed. The number of overpulses is equal to P2_OVP_ADD+N×P2_OVP_MULT, where P2_OVP_ADD and P2_OVP_MULT are predetermined overpulse constants. In a preferred embodiment, P2_OVP_ADD=0 and P2_OVP_MULT=0, so that no overpulses are applied to the cell.

If at step 205 the cell cannot be verified, meaning the (N+1)th pulse has not raised the cell to the desired programmed voltage, then at step 207 N is tested to see if it is less than P2_MAX_PULSES, which represents a predetermined maximum number of pulses to be applied to any one cell during the second programming pass. In a preferred embodiment, P2_MAX_PULSES=80. If N is less than or equal to P2_MAX_PULSES, then at step 208, N is incremented by 1 and the process returns to step 204. If at step 207 N is greater than P2_MAX_PULSES, then at step 209, the value of P2_ABORT_ON_FAIL, which determines whether or not additional attempts to program the device should be made, is examined. If P2_ABORT_ON_FAIL=YES, meaning no further attempts should be made, then at step 210 the device is considered to have failed the programming process, which ends there. If, as in a preferred embodiment, P2_ABORT_ON_FAIL=NO, then at step 211, P2_OVP_FAIL overpulses are applied to the cell, just in case they prove sufficient to program the cell. This can be done because one may be prepared to apply a certain number of overpulses to the cell at step 206 even if programming were successful. In a preferred embodiment, P2_OVP_FAIL=80, consistent with P2_MAX_PULSES=80.

At step 212, after the application of overpulses (if any) at step 206 or 211, there is a test to determine if all cells logged in step 113 have been addressed yet in the second programming pass. If all cells have not yet been addressed, the process returns to step 203, now pointing to the next address to be programmed. If all cells have been addressed, then at step 213 then entire device is verified by testing each cell against a test voltage VMARG=VMARG_P2_CHALLENGE, which, in a preferred embodiment, is 8.2 volts. Those cells which fail this verification are logged for further programming in third programming pass 300, which begins at step 301.

At step 302, in preparation for third programming pass 300, VMARG is set to VMARG_P3_AIM, the target voltage for the third programming pass. In a preferred embodiment, VMARG_P3_AIM=8.2 volts. At step 303, a counter N, which represents the number of programming pulses applied, is set to zero. At step 304, a cell that had been logged in step 213 is programmed with one programming pulse.

If at step 305 the cell can be verified at VMARG_P3_AIM, meaning that the (N+1)th pulse raised the cell to the desired programmed voltage, then at step 306 a number of overpulses is applied to the cell to further raise the cell voltage to protect it against disturbances that might otherwise cause the cell to become unprogrammed. The number of overpulses is equal to P3_OVP_ADD+N×P3_OVP_MULT, where P3_OVP_ADD and P3_OVP_MULT are predetermined overpulse constants. In a preferred embodiment, P3_OVP_ADD=0 and P3_OVP_MULT=0, so that no overpulses are applied to the cell.

If at step 305 the cell cannot be verified, meaning the (N+1)th pulse has not raised the cell to the desired programmed voltage, then at step 307 N is tested to see if it is less than P3_MAX_PULSES, which represents a predetermined maximum number of pulses to be applied to any one cell during the third programming pass. In a preferred embodiment, P3_MAX_PULSES=100. If N is less than or equal to P3_MAX_PULSES, then at step 308, N is incremented by 1 and the process returns to step 304. If at step 307 N is greater than P3_MAX_PULSES, then at step 309, the value of P3_ABORT_ON_FAIL, which determines whether or not additional attempts to program the device should be made, is examined. If P3_ABORT_ON_FAIL=YES, meaning no further attempts should be made, then at step 310 the device is considered to have failed the programming process, which ends there. If, as in a preferred embodiment, P3_ABORT_ON_FAIL=NO, then at step 311, P3_OVP_FAIL overpulses are applied to the cell, just in case they prove sufficient to program the cell. This can be done because one may be prepared to apply a certain number of overpulses to the cell at step 306 even if programming were successful. In a preferred embodiment, P3_OVP_FAIL=100, consistent with P3_MAX_PULSES=100.

At step 312, after the application of overpulses (if any) at step 306 or 311, there is a test to determine if all cells logged in step 213 have been addressed yet in the third programming pass. If all cells have not yet been addressed, the process returns to step 303, now pointing to the next address to be programmed. If all cells have been addressed, then at step 313 the entire device is verified by testing each cell against a test voltage VMARG=VMARG_P3_CHALLENGE, which, in a preferred embodiment, is 8.2 volts. Those cells which fail this verification are logged. At step 314, the log is examined for failures. If no failures are found, then at step 315 the device is considered to have been programmed successfully. If failures are found in step 314, then at step 316 the device is considered to have failed the programming process. Alternatively, at step 316 the device may enter a remedial programming process of a previously known type.

Thus it is seen that the present invention provides a method of programming programmable logic devices that is faster than known programming methods, that achieves a higher programmed voltage, and that decreases the number of failed devices. This invention also provides such a programming method that minimizes the stress on the device and the disturbance of already programmed cells. One skilled in the art will appreciate that the present invention can be practiced by other than the described embodiments, which are presented for purposes of illustration and not of limitation, and the present invention is limited only by the claims which follow.

What is claimed is:

1. A method for programming a programmable logic device, said device having an array of erasable programmable read-only memory cells, each of which has a threshold voltage, and to each of which at least one high-voltage programming pulse must ordinarily be applied for a predetermined duration to program said programmable logic device, said method comprising the steps of:

selecting a first duration shorter than said predetermined duration;

applying a first number of high-voltage programming pulses to each of said erasable programmable read-only memory cells, each of said high-voltage programming pulses having a first magnitude and having said first duration, said number being at least one;

selecting a second duration shorter than said first duration; and applying a second number of high-voltage programming pulses to each of said erasable programmable read-only memory cells, each of said high-voltage programming pulses having a second magnitude and having said second duration, said second number being at least one.

2. The programming method of claim 1 further comprising the steps of:

after each one of said first number of high-voltage programming pulses of said first magnitude and said first duration has been applied to one of said erasable programmable read-only memory cells, measuring the threshold voltage of said one of said erasable programmable read-only memory cells; and if said threshold voltage as measured at least equals a first predetermined voltage, discontinuing the programming of said one of said erasable programmable read-only memory cells.

3. The programming method of claim 1 further comprising the steps of:

counting in a first counting step the first number of said high-voltage programming pulses of said first magnitude and said first duration applied to one of said erasable programmable read-only memory cells;

after each one of said first number of high-voltage programming pulses of said first magnitude and said first duration has been applied to said one of said erasable programmable read-only memory cells and has been counted, measuring the threshold voltage of said one of said erasable programmable read-only memory cells; and if said threshold voltage as measured at least equals a first predetermined voltage, applying again to said one of said erasable programmable read-only memory cells the first number of high-voltage programming pulses counted in said first counting step, and discontinuing the programming of said one of said erasable programmable read-only memory cells.

4. The programming method of claim 1 wherein there is a first predetermined maximum number of said high-voltage programming pulses of said first duration to be applied to each of said erasable programmable read-only memory cells.

5. The programming method of claim 4 further comprising the steps of:

counting in a first counting step the first number of said high-voltage programming pulses of said first magnitude and said first duration applied to one of said erasable programmable read-only memory cells;

after each one of said first number of high-voltage programming pulses of said first magnitude and said first duration has been applied to said one of said erasable programmable read-only memory cells and has been counted, measuring the threshold voltage of said one of said erasable programmable read-only memory cells;

if said threshold voltage as measured at least equals a first predetermined voltage, applying again to said one of said erasable programmable read-only memory cells the first number of high-voltage programming pulses of said first magnitude and said first duration counted in said first counting step, and discontinuing the programming of said one of said erasable programmable read-only memory cells; and if after said first predetermined maximum number of high-voltage programming pulses of said first magnitude and said first duration have been applied said threshold voltage as measured is less than said fist predetermined voltage, applying again to said one of said erasable programmable read-only memory cells said first predetermined maximum number of high-voltage programming pulses of said first magnitude and said first duration, measuring again said threshold voltage of said one of said erasable programmable read-only memory cells, and, if said threshold voltage as measured is at least equal to said first predetermined voltage, discontinuing the programming of said one of said erasable programmable read-only memory cells.

6. The programming method of claim 1 further comprising the steps of:

after each one of said second number of high-voltage programming pulses of said second magnitude and said second duration has been applied to one of said erasable programmable read-only memory cells, measuring the threshold voltage of said one of said erasable programmable read-only memory cells; and if said threshold voltage as measured at least equals a second predetermined voltage, discontinuing the programming of said one of said erasable programmable read-only memory cells.

7. The programming method of claim 6 wherein said second predetermined voltage is at least equal to said first predetermined voltage.

8. The programming method of claim 7 wherein said second predetermined voltage is higher than said first predetermined voltage.

9. The programming method of claim 1 further comprising the steps of:

counting in a second counting step the second number of high-voltage programming pulses of said second magnitude and said second duration applied to one of said erasable programmable read-only memory cells;

after each one of said second number of high-voltage programming pulses of said second magnitude and said second duration has been applied to said one of said erasable programmable read-only memory cells and has been counted, measuring the threshold voltage of said one of said erasable programmable read-only memory cells; and if said threshold voltage as measured at least equals a second predetermined voltage, applying again to said one of said erasable programmable read-only memory cells the second number of high-voltage programming pulses of said second magnitude and said second duration counted in said second counting step, and discontinuing the programming of said one of said erasable programmable read-only memory cells.

10. The programming method of claim 1 wherein there is a second predetermined maximum number of high-voltage programming pulses of said second magnitude and said second duration to be applied to said one of said erasable programmable read-only memory cells.

11. The programming method of claim 10 further comprising the steps of:

counting in a second counting step the second number of said high-voltage programming pulses of said second duration applied to one of said erasable programmable read-only memory cells;

after each one of said second number of high-voltage programming pulses of said second duration has been applied to said one of said erasable programmable read-only memory cells and has been counted, measuring the threshold voltage of said one of said erasable programmable read-only memory cells;

if said threshold voltage as measured at least equals a second predetermined voltage, applying again to said one of said erasable programmable read-only memory cells the second number of high-voltage programming pulses of said second magnitude and said second duration counted in said second counting step, and discontinuing the programming of said one of said erasable programmable read-only memory cells; and if after said second predetermined maximum number of high-voltage programming pulses of said second magnitude and said second duration have been applied said threshold voltage as measured is less than said second predetermined voltage, applying again to said one of said erasable programmable read-only memory cells said second predetermined maximum number of high-voltage programming pulses of said second magnitude and said second duration, measuring again said threshold voltage of said one of said erasable programmable read-only memory cells, and, if said threshold voltage as measured is at least equal to said second predetermined voltage, discontinuing the programming of said one of said erasable programmable read-only memory cells.

12. The programming method of claim 10 wherein said second predetermined maximum number is at least equal to said first predetermined maximum number.

13. The programming method of claim 1 further comprising the steps of:

selecting a third duration at most as long as said second duration; and applying a third number of high-voltage programming pulses to each of said erasable programmable read-only memory cells, each of said high-voltage programming pulses having a third magnitude and said third duration, said third number being at least one.

14. The programming method of claim 13 further comprising the steps of:

after each of said third number of high-voltage programming pulses of said third magnitude and said third duration to one of said erasable programmable read-only memory cells, measuring the threshold voltage of said one of said erasable programmable read-only memory cells; and if said threshold voltage as measured at least equals a third predetermined voltage, discontinuing the programming of said one of said erasable programmable read-only memory cells.

15. The programming method of claim 1 wherein said third predetermined voltage is at least equal to said second predetermined voltage.

16. The programming method of claim 5 wherein said third predetermined voltage is higher than said second predetermined voltage.

17. The programming method of claim 13 further comprising the steps of:
- counting in a third counting step the third number of high-voltage programming pulses of said third magnitude and said third duration applied to one of said erasable programmable read-only memory cells;
- after each one of said third number of high-voltage programming pulses of said third magnitude and said third duration has been applied to said one of said erasable programmable read-only memory cells and has been counted, measuring the threshold voltage of said one of said erasable programmable read-only memory cells; and
- if said threshold voltage as measured at least equals a third predetermined voltage, applying again to said one of said erasable programmable read-only memory cells the third number of high-voltage programming pulses of said third magnitude and said third duration counted in said third counting step, and discontinuing the programming of said one of said erasable programmable read-only memory cells.

18. The programming method of claim 13 wherein there is a third predetermined maximum number of high-voltage programming pulses of said third magnitude and said third duration to be applied to said one of said erasable programmable read-only memory cells.

19. The programming method of claim 18 further comprising the steps of:
- counting in a third counting step the third number of high-voltage programming pulses of said third magnitude and said third duration applied to one of said erasable programmable read-only memory cells;
- after each one of said third number of high-voltage programming pulses of said third duration has been applied to said one of said erasable programmable read-only memory cells and has been counted, measuring the threshold voltage of said one of said erasable programmable read-only memory cells;
- if said threshold voltage as measured at least equals a third predetermined voltage, applying again to said one of said erasable programmable read-only memory cells the third number of high-voltage programming pulses of said third magnitude and said third duration counted in said third counting step, and discontinuing the programming of said one of said erasable programmable read-only memory cells; and
- if after said third predetermined maximum number of high-voltage programming pulses of said third magnitude and said third duration have been applied said threshold voltage as measured is less than said third predetermined voltage, applying again to said one of said erasable programmable read-only memory cells said third predetermined maximum number of high-voltage programming pulses of said third magnitude and said third duration, measuring again said threshold voltage of said one of said erasable programmable read-only memory cells, and, if said threshold voltage as measured is at least equal to said third predetermined voltage, discontinuing the programming of said one of said erasable programmable read-only memory cells.

20. The programming method of claim 18 wherein said third predetermined maximum number is at least equal to said second predetermined maximum number.

21. The programming method of claim 13 wherein said third magnitude is at least equal to said second magnitude.

22. The programming method of claim 21 wherein said third magnitude is greater than said second magnitude.

23. The programming method of claim 1 wherein said second magnitude is at least equal to said first magnitude.

24. The programming method of claim 23 wherein said second magnitude is greater than said first magnitude.

25. A method for programming a programmable logic device, said device having an array of erasable programmable read-only memory cells, each of which has a threshold voltage, and to each of which at least one high-voltage programming pulse must ordinarily be applied for a predetermined duration to program said programmable logic device, said method comprising the steps of:
- selecting a first duration shorter than said predetermined duration;
- applying a first number of high-voltage programming pulses to each of said erasable programmable read-only memory cells, each of said high-voltage programming pulses having a first magnitude and having said first duration, said number being at least one;
- selecting a second duration at most as long as said first duration;
- applying a second number of high-voltage programming pulses to each of said erasable programmable read-only memory cells, each of said high-voltage programming pulses having a second magnitude and having said second duration, said second number being at least one;
- selecting a third duration that is shorter than said second duration; and
- applying a third number of high-voltage programming pulses to each of said erasable programmable read-only memory cells, each of said high-voltage programming pulses having a third magnitude and said third duration, said third number being at least one.

26. A method for programming a programmable logic device, said device having an array of erasable programmable read-only memory cells, each of which has a threshold voltage, and to each of which at least one high-voltage programming pulse must ordinarily be applied for a predetermined duration to program said programmable logic device, said method comprising the steps of:
- selecting a first duration shorter than said predetermined duration;
- applying a first number of high-voltage programming pulses to each of said erasable programmable read-only memory cells, each of said high-voltage programming pulses having a first magnitude and having said first duration, said number being at least one;
- selecting a second duration at most as long as said first duration; and
- applying a second number of high-voltage programming pulses to each of said erasable programmable read-only memory cells, each of said high-voltage programming pulses having a second magnitude and having said second duration, said second number being at least one, wherein there is a second predetermined maximum number of high-voltage programming pulses of said second magnitude and said second duration to be applied to said one of said erasable programmable read-only memory cells, said second predetermined maximum number being greater than said first predetermined maximum number.

27. A method for programming a programmable logic device, said device having an array of erasable programmable read-only memory cells, each of which has a threshold voltage, and to each of which at least one high-voltage programming pulse must ordinarily be applied for a predetermined duration to program said programmable logic device, said method comprising the steps of:
  selecting a first duration shorter than said predetermined duration;
  applying a first number of high-voltage programming pulses to each of said erasable programmable read-only memory cells, each of said high-voltage programming pulses having a first magnitude and having said first duration, said number being at least one;
  selecting a second duration at most as long as said first duration;
  applying a second number of high-voltage programming pulses to each of said erasable programmable read-only memory cells, each of said high-voltage programming pulses having a second magnitude and having said second duration, said second number being at least one;
  selecting a third duration at most as long as said second duration; and
  applying a third number of high-voltage programming pulses to each of said erasable programmable read-only memory cells, each of said high-voltage programming pulses having a third magnitude and said third duration, said third number being at least one, wherein there is a third predetermined maximum number of high-voltage programming pulses of said third magnitude and said third duration to be applied to said one of said erasable programmable read-only memory cells, said second magnitude is greater than said first magnitude, and said third predetermined maximum number is greater than said second predetermined maximum number.

28. A method for programming a programmable logic device, said device having an array of erasable programmable read-only memory cells, each of which has a threshold voltage, and to each of which at least one high voltage programming pulse must ordinarily be applied for a predetermined duration to program said programmable logic device, said method comprising the steps of:
  applying successive groups of plural numbers of pulses to each of said erasable programmable read-only memory cells, each pulse having a duration less than said predetermined duration;
  after applying each group of pulses to said erasable programmable read-only memory cells, measuring the threshold voltages of said erasable programmable read-only memory cells; and
  discontinuing the programming of those of said erasable programmable read-only memory cells that have measured threshold voltages at least equal to a predetermined voltage.

29. The programming method of claim 28 wherein the number of pulses in each group is greater than the number in the preceding group.

30. A method for programming a programmable logic device, said device having an array of erasable programmable read-only memory cells, each of which has a threshold voltage, and to each of which at least one high-voltage programming pulse must be applied for a predetermined duration to program said programmable logic device, said method comprising the steps of:
  selecting a first duration shorter than said predetermined duration;
  applying a first number of high-voltage programming pulses to each of said erasable programmable read-only memory cells, each of said first number of high-voltage programming pulses having a first magnitude and having said first duration, said first number being at least one and at most a first predetermined maximum number;
  counting in a first counting step the first number of said high-voltage programming pulses of said first magnitude and said first duration applied to one of said erasable programmable read-only memory cells;
  after each one of said first number of high-voltage programming pulses of said first magnitude and said first duration has been applied to said one of said erasable programmable read-only memory cells and has been counted, measuring the threshold voltage of said one of said erasable programmable read-only memory cells;
  if said threshold voltage as measured at least equals a first predetermined voltage, applying again to said one of said erasable programmable read-only memory cells the first number of high-voltage programming pulses counted in said first counting step, and discontinuing the programming of said one of said erasable programmable read-only memory cells;
  if after said first predetermined maximum number of high-voltage programming pulses of said first magnitude and said first duration have been applied said threshold voltage as measured is less than said first predetermined voltage, applying again to said one of said erasable programmable read-only memory cells said first predetermined maximum number of high-voltage programming pulses of said first magnitude and said first duration, measuring again said threshold voltage of said one of said erasable programmable read-only memory cells, and, if said threshold voltage as measured is at least equal to said first predetermined voltage, discontinuing the programming of said one of said erasable programmable read-only memory cells; and
  otherwise, applying a second number of high-voltage programming pulses to each of said erasable programmable read-only memory cells, each of said second number of high-voltage programming pulses having a second magnitude greater than said first magnitude and having a second duration shorter than said first duration, said second number being at least one and at most a second predetermined maximum number greater than said first predetermined maximum number;
  counting in a second counting step the second number of high-voltage programming pulses of said second magnitude and said second duration applied to one of said erasable programmable read-only memory cells;

after each one of said second number of high-voltage programming pulses of said second magnitude and said second duration has been applied to said one of said erasable programmable read-only memory cells and has been counted, measuring the threshold voltage of said one of said erasable programmable read-only memory cells;

if said threshold voltage as measured at least equals a second predetermined voltage higher than said first predetermined voltage, applying again to said one of said erasable programmable read-only memory cells the second number of high-voltage programming pulses counted in said second counting step, and discontinuing the programming of said one of said erasable programmable read-only memory cells; and it after said second predetermined maximum number of high-voltage programming pulses of said second magnitude and said second duration have been applied said threshold voltage as measured is less than said second predetermined voltage, applying again to said one of said erasable programmable read-only memory cells said second predetermined maximum number of high-voltage programming pulses of said second magnitude and said second duration, measuring again said threshold voltage of said one of said erasable programmable read-only memory cells, and, if said threshold voltage as measured is at least equal to said second predetermined voltage, discontinuing the programming of said one of said erasable programmable read-only memory cells;

otherwise, applying a third number of high-voltage programming pulses to each of said erasable programmable read-only memory cells, each of said third number of high-voltage programming pulses having a third magnitude greater than said second magnitude and having a third duration shorter than said second duration, said number being at least one and at most a third predetermined maximum number greater than said second predetermined maximum number;

counting in a third counting step the third number of high-voltage programming pulses of said third magnitude and said third duration applied to one of said erasable programmable read-only memory cells;

after each one of said third number of high-voltage programming pulses of said third magnitude and said third duration has been applied to said one of said erasable programmable read-only memory cells and has been counted, measuring the threshold voltage of said one of said erasable programmable read-only memory cells;

if said threshold voltage as measured at least equals a third predetermined voltage higher than said second predetermined voltage, applying again to said one of said erasable programmable read-only memory cells third the number of high-voltage programming pulses counted in said third counting step, and discontinuing the programming of said one of said erasable programmable read-only memory cells;

if after said third predetermined maximum number of high-voltage programming pulses of said third magnitude and said third duration have bene applied said measured voltage is less than said third predetermined voltage, applying again to said one of said erasable programmable read-only memory cells said third predetermined maximum number of high-voltage programming pulses of said third magnitude and said third duration, measuring again said threshold voltage of said one of said erasable programmable read-only memory cells, and, if said threshold voltage as measured is at least equal to said third predetermined voltage, discontinuing the programming of said one of said erasable programmable read-only memory cells; and otherwise, rejecting said programmable logic device.

* * * * *

UNITED STATES PATENT AND TRADEMARK OFFICE
CERTIFICATE OF CORRECTION

PATENT NO. : 5,200,920

DATED : April 6, 1993

INVENTOR(S) : Kevin A. Norman et al.

Page 1 of 2

It is certified that error appears in the above-identified patent and that said Letters Patent is hereby corrected as shown below:

Cover page, at [56] References Cited, under U.S. PATENT DOCUMENTS, "4,357,685 11/1082 Daniele et al. ..... 365/185" should be -- 4,357,685 11/1982 Daniele et al. ..... 365/185 --;

under OTHER PUBLICATIONS, in the second listing, "algorithm" should be -- Algorithm --.

Column 1, line 7, "now" should be deleted;

line 8, "PROGRAMING" should be -- PROGRAMMING --.

Column 2, line 1, after "able" should be inserted -- to --.

Column 3, line 20, "i" should be -- 1 --.

Column 5, lines 29-30, "P1_ABORT_ON FAIL" should be -- P1_ABORT_ON_FAIL --;

line 49, "then" should be -- the --;

line 54, "201. programming" should be: -- 201.
    At step 202, in preparation for second programming --.

Column 6, line 38, "then" (second occurrence) should be -- the --.

Column 7, lines 10-11, "P3_ABORT_$_1$ON_FAIL" should be -- P3_ABORT_ON_FAIL --.

UNITED STATES PATENT AND TRADEMARK OFFICE
CERTIFICATE OF CORRECTION

PATENT NO. : 5,200,920
DATED : April 6, 1993
INVENTOR(S) : Kevin A. Norman et al.

It is certified that error appears in the above-indentified patent and that said Letters Patent is hereby corrected as shown below:

Claim 5, column 9, line 9, "fist" should be -- first --.

Claim 30, column 16, line 20, "third the" should be -- the third --;

line 27, "bene" should be -- been --.

Signed and Sealed this

Third Day of May, 1994

Attest:

BRUCE LEHMAN

Attesting Officer      Commissioner of Patents and Trademarks